(12) United States Patent
Tung et al.

(10) Patent No.: US 9,019,705 B2
(45) Date of Patent: Apr. 28, 2015

(54) SERVER SYSTEM AND SERVER THEREOF

(71) Applicants: Inventec (Pudong) Technology Corporation, Shanghai (CN); Inventec Corporation, Taipei (TW)

(72) Inventors: Kai-Yang Tung, Taipei (TW); Wei-Hsuan Chang, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 274 days.

(21) Appl. No.: 13/801,985

(22) Filed: Mar. 13, 2013

(65) Prior Publication Data

US 2014/0085808 A1 Mar. 27, 2014

(30) Foreign Application Priority Data

Sep. 27, 2012 (CN) .......................... 2012 1 0369305

(51) Int. Cl.
*H05K 7/20* (2006.01)
*G06F 1/20* (2006.01)
*H05K 9/00* (2006.01)

(52) U.S. Cl.
CPC .............. *G06F 1/20* (2013.01); *H05K 7/20736* (2013.01); *H05K 7/20809* (2013.01); *H05K 9/0007* (2013.01); *G06F 2200/201* (2013.01)

(58) Field of Classification Search
CPC combination set(s) only.
See application file for complete search history.

(56) References Cited

U.S. PATENT DOCUMENTS

| | | | |
|---|---|---|---|
| 2003/0147216 A1* | 8/2003 | Patel et al. | 361/700 |
| 2006/0002080 A1* | 1/2006 | Leija et al. | 361/687 |
| 2013/0286292 A1* | 10/2013 | Yamaguchi et al. | 348/725 |
| 2014/0085828 A1* | 3/2014 | Wang | 361/710 |

* cited by examiner

*Primary Examiner* — Gregory Thompson
(74) *Attorney, Agent, or Firm* — Huffman Law Group, PC

(57) ABSTRACT

A server system and a server thereof are provided. The server system includes a rack, a server, and a fan module, wherein the server and the fan module are located in the rack. The server includes a chassis, a circuit board, a first heat source, a second heat source, a liquid cooling device, and a shielding cover. The circuit board is disposed on the chassis, and the first heat source and the second heat source are disposed on the circuit board. The liquid cooling device is thermally connected to the second heat source covered by the shielding cover. When the fan module is in operation, outside air is taken into the server by the fan module. The flow rate of an air flow passing by the first heat source is greater than that of another air flow passing by the second heat source capped by the shielding cover.

10 Claims, 6 Drawing Sheets

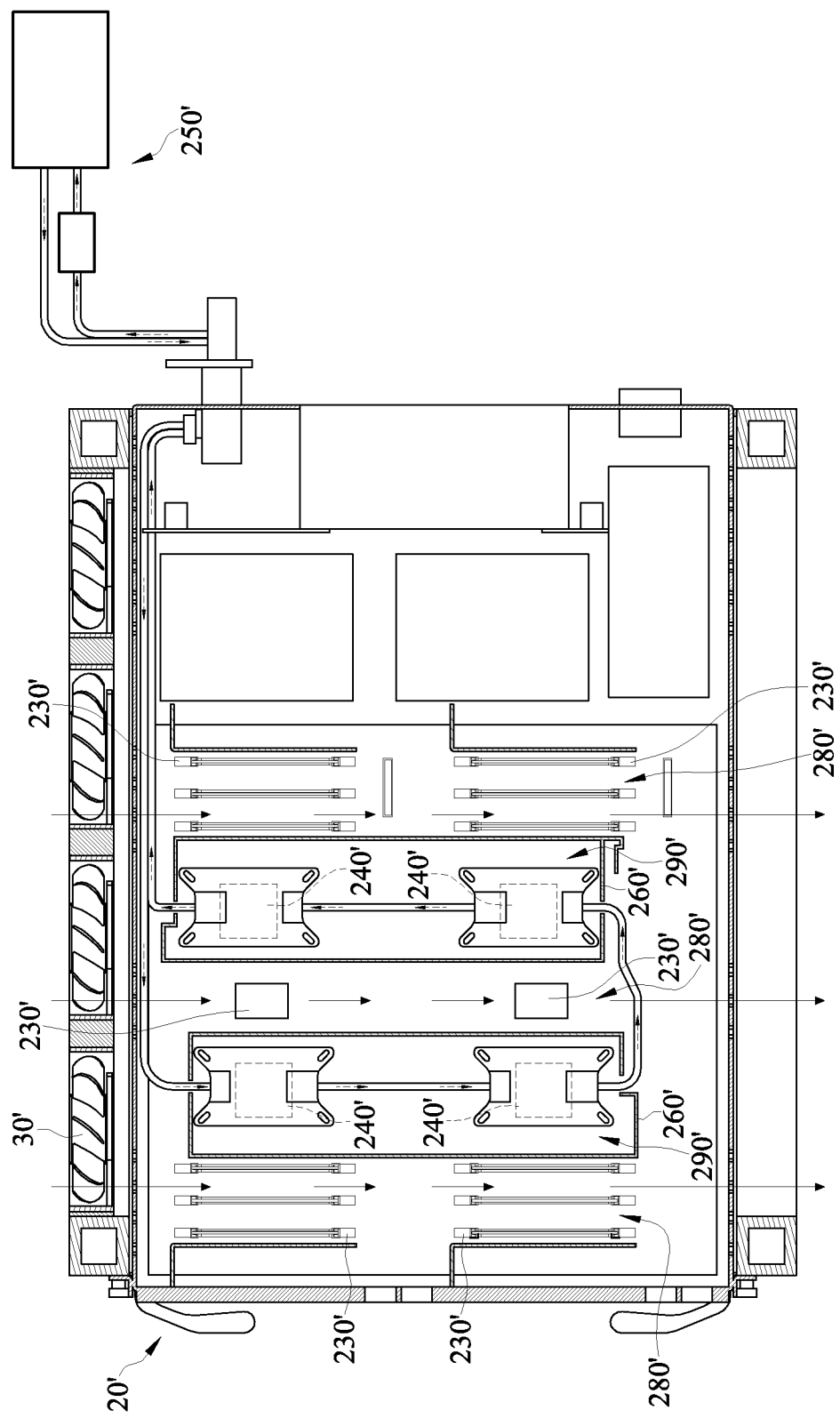

SERVER SYSTEM AND SERVER THEREOF

CROSS-REFERENCE TO RELATED APPLICATIONS

This non-provisional application claims priority under 35 U.S.C. §119(a) on Patent Application No(s). 201210369305.0 filed in China on Sep. 27, 2012, the entire contents of which are hereby incorporated by reference.

BACKGROUND OF THE INVENTION

1. Field of the Invention

The present disclosure relates to an electronic digital data processing device and more particularly to a server system and a server thereof.

2. Description of the Related Art

With advances in modern technology, society has entered the era of the internet and our daily lives became inseparable from the use of networking technologies. As the number of internet users increases, demands in developing hardware for operating internet protocols increase. Therefore, server systems used for supporting the internet now play an important role.

Presently, application developments of server system technology not only have combined internet and telecommunication, but also have emerged in finance, investment, online banking, and/or online-credit-card transactions. All these applications heavily rely on server systems for a large amount of computing and protection of confidential information. In a local network, the internet, or other networks, server systems are used for processing and storing information and distributing needed data and information to other digital data processing devices through terminals of the server systems.

A conventional tower-type server system is bulky. When multiple tower-server systems are arranged in enterprise configurations, the amount of space required by the server systems becomes a problem. In recent years, rack-type systems have been developed and have become mainstream with regard to system configuration, storage, and installation of server systems. In rack-type systems, multiple servers are disposed in a rack and each server has its central processing unit, a set of chips, memory, and hard disk, and operates independently so that servers are stacked on each other in the rack while still being freely selected and detached.

However, compactly arranged servers, disposed in a rack, continue generating thermal heat which, if not dissipated quickly, can affect the operation of a server system. Therefore, how to design a server system with improved heat dissipation is presently a challenge to engineers and technical designers in the data center.

BRIEF DESCRIPTION OF THE DRAWINGS

The present disclosure will become more fully understood from the detailed description given herein below by way of example with reference to the accompanying drawings, and thus are not limitative of the present disclosure, wherein:

FIG. 4 is a cross-sectional top view of a server according to another embodiment of the present disclosure.

SUMMARY OF THE INVENTION

An embodiment of the disclosure provides a server system comprising a rack, a server, and a fan module. The server and the fan module are located in the rack. The server comprises a chassis, a circuit board, a first heat source, a second heat source, a liquid cooling device, and a shielding cover. The circuit board is disposed on the chassis. The first heat source and the second heat source are both disposed on the circuit board. The shielding cover is disposed on the chassis. The liquid cooling device is thermally connected to the second heat source which is covered by the shielding cover. When the fan module is in operation, the outside air is taken into the server by the fan module. The second heat source is capped by the shielding cover such that the flow rate of an air flow passing by the first heat source is greater than the flow rate of another air flow passing by the second heat source.

Another embodiment of the disclosure provides a server comprising a chassis, a circuit board, a first heat source, a second heat source, a liquid cooling device, and a shielding cover. The circuit board is disposed on the chassis. The first heat source and the second heat source are both disposed on the circuit board. The liquid cooling device is thermally connected to the second heat source which is covered by the shielding cover. The shielding cover is disposed on the chassis such that the flow rate of an air flow passing by the first heat source is greater than the flow rate of another air flow passing by the second heat source.

DETAILED DESCRIPTION

The novel features which are characteristic of the present disclosure are set forth in the appended claims. Advantages of the present disclosure and the disclosure's preferred embodiments are better understood and implemented by reference to the following detailed descriptions in connection with the accompanying drawings to those who are familiar with the related technology. The following descriptions are exemplary embodiments only to address the features and advantages, and are not intended to limit the scope, applicability, or configuration of the present disclosure in any way.

The terms used in the exemplary embodiments, such as a first, a second, and a third, are to distinguish among different components, composition, and domains in the figures associated therewith. Various changes to the described embodiments may be made in the functionality and arrangement of the elements described without departing from the scope of the disclosure in the components, composition, and domains as set forth in the claims herein. In other words, the first component, the first composition, and the first domain described in the preferred embodiments can also be the second component, the second composition, and the second domain instead.

Figure 1:
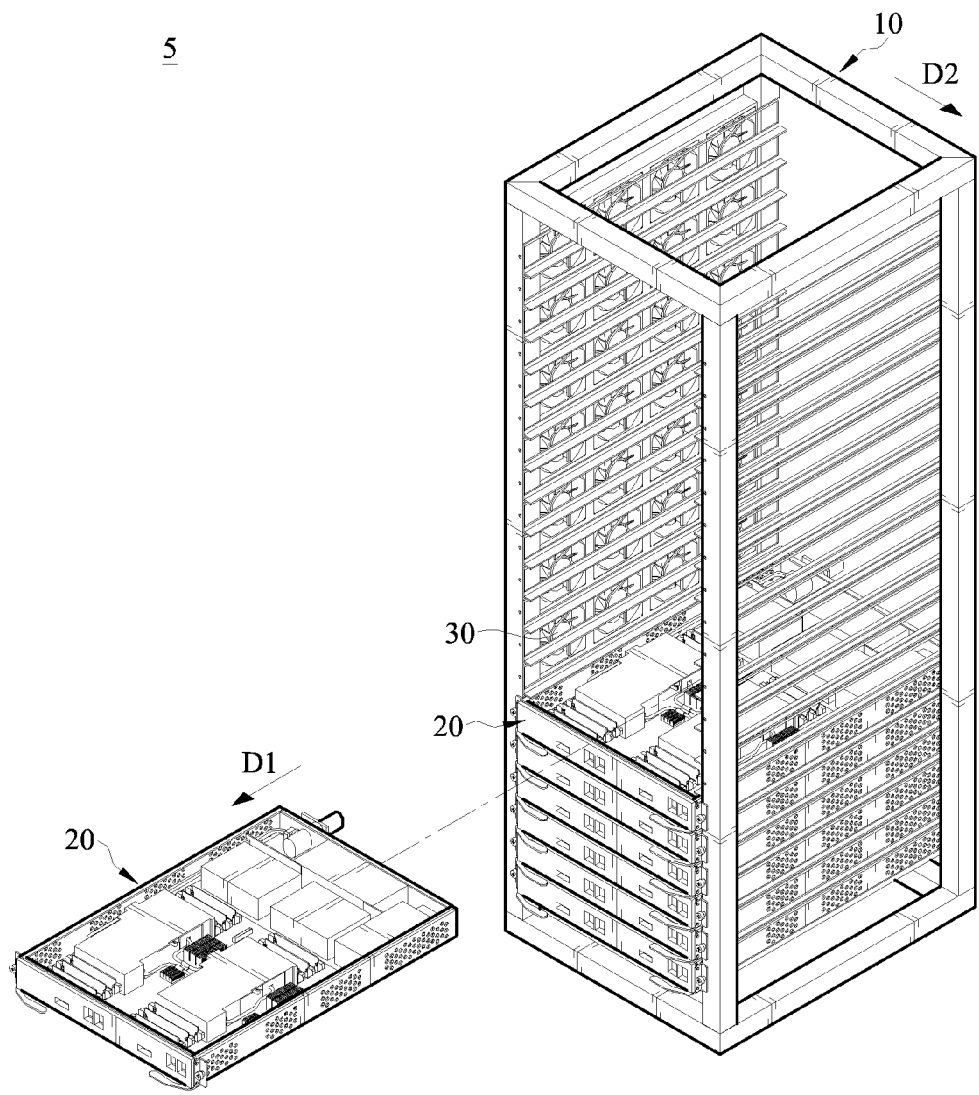
FIG. 1 is a schematic perspective view of a server system according to an embodiment of the present disclosure.

Please refer to FIG. 1, which is a schematic perspective view of a server system according to an embodiment of the present disclosure. A server system 5 includes a rack 10, a server 20, and a fan module 30. The server 20 and the fan module 30 are both located in the rack 10. The server 20 may be inserted in or removed from the rack 10 along a first direction D1. An air flow, produced by the fan module 30, flows within the rack 10 along a second direction D2. In the present embodiment, the first direction D1 is perpendicular to the second direction D2, but not limited to the present disclosure. In other embodiment, the first direction D1 may be parallel to the second direction D2.

Figure 2A:
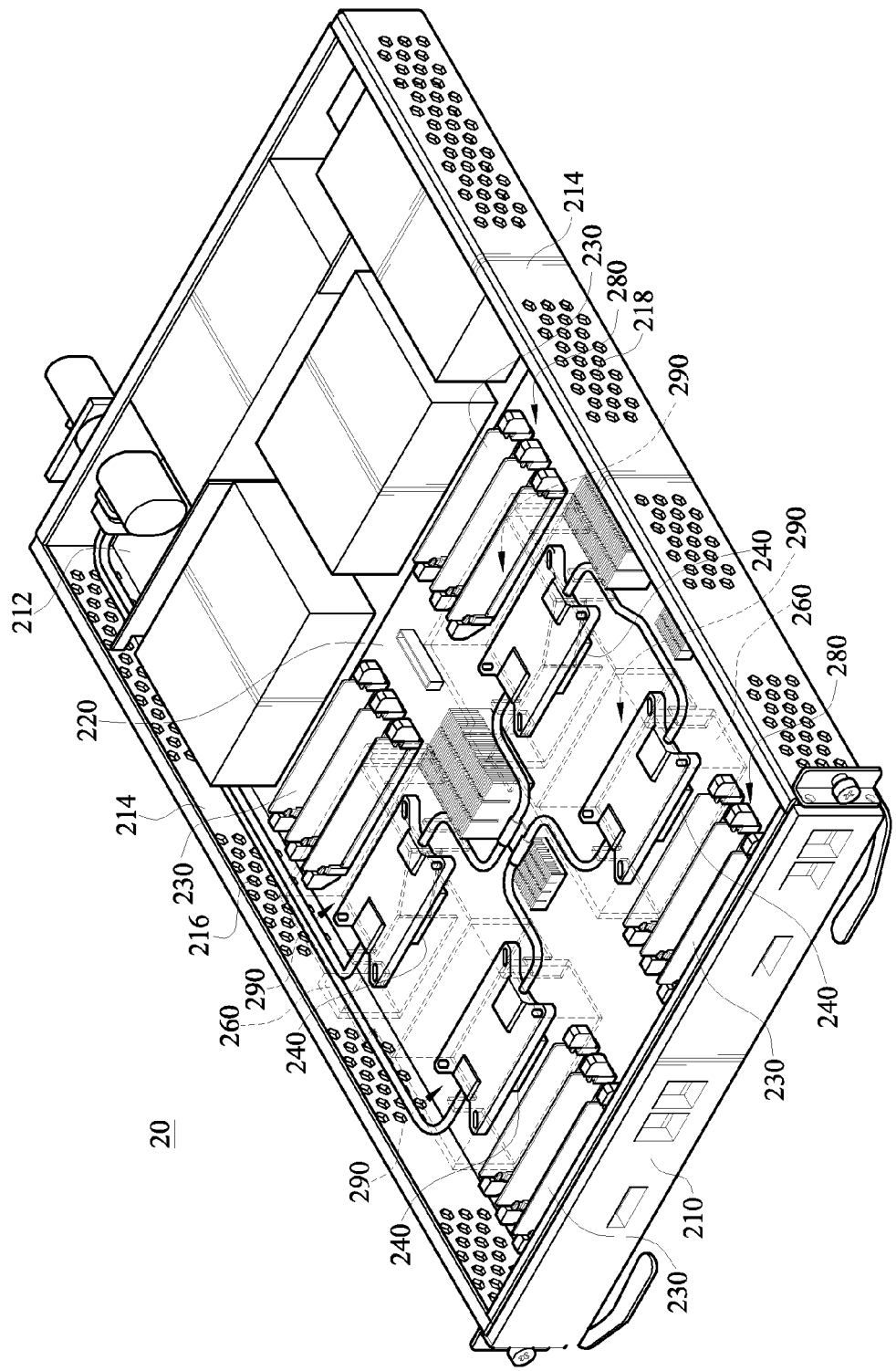
FIG. 2A is a schematic perspective view of a server in FIG. 1 according to the present disclosure.
Figure 2B:
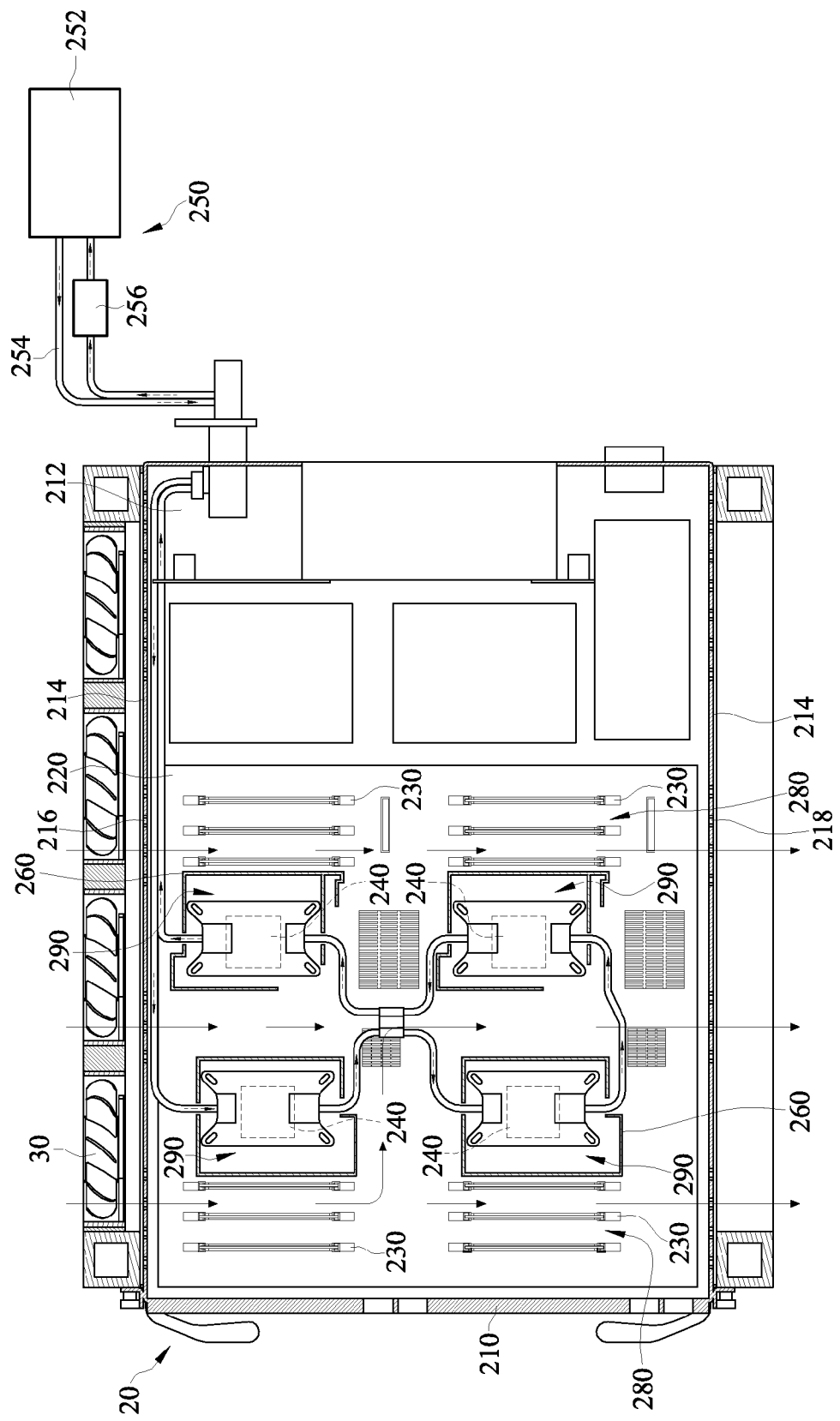
FIG. 2B is a cross-sectional top view of a server and a fan module in FIG. 1 according to the present disclosure.

Further details of the server are given in the following illustration. With reference to FIGS. 2A and 2B, FIG. 2A is a schematic perspective view of a server in FIG. 1 according to the present disclosure, and FIG. 2B is a cross-sectional top view of a server and a fan module in FIG. 1 according to the present disclosure. The server 20 comprises a chassis 210, a circuit board 220, a first heat source 230, a second heat source 240, a liquid cooling device 250, and a shielding cover 260. The circuit board 220 is disposed on the chassis 210. The first heat source 230 and the second heat source 240 are both disposed on the circuit board 220. The liquid cooling device 250 is thermally connected to the second heat source 240 and thermal heat generated by the second heat source 240 is carried away by the liquid cooling device 250. In addition, thermal power, generated by the first heat source 230, is less than that by the second heat source 240. By applying the liquid cooling device 250 to dissipate heat from the second heat source 240, the air flow, produced by the fan module 30, is only used for dissipating heat from the first heat source 230, which saves more energy. In this embodiment, the first heat source 230 may be a north bridge and the second heat source 240 may be a south bridge or a central processing unit, for example, but such are not limited by the disclosure.

The shielding cover 260, disposed on the chassis 210 and covering the second heat source 240, separates the space inside the server 20 into an air-cooled space 280 and a liquid-cooled space 290. In the air-cooled space 280, the fan module 30 is used for removing the thermal heat generated by the first heat source 230 therein away from the server 20. On the other hand, in the liquid-cooled space 290, the liquid cooling device 250 is used for removing the thermal heat generated by the second heat source 240 therein away from the server 20.

Further explanations of how the dissipation process is carried out by the fan device 30 to cool the air-cooled space 280 are described as follows. In the present embodiment and other embodiments of the present disclosure, the chassis 210 includes a main board 212 and two side walls 214. The side walls 214 are opposite to each other. One of the side wall 214 includes an air inlet 216 and the other side wall 214 includes another air outlet 218. The air inlet 216 and the air outlet 218 are positioned in correspondence to the first heat source 230, respectively. When the fan module 30 operates, an outside air is taken into the server 20 through the air inlet 216, it undergoes heat exchange with the first heat source 230 in the air-cooled space 280, and consequently removes the thermal heat generated by the first heat source 230, and is exhausted from the server 20 through the air outlet 218.

In the following paragraphs, examples are given to illustrate how the thermal heat generated by the second heat source 240 is carried out of the server 20 by the liquid cooling device 250. In the present embodiment and other embodiments of the present disclosure, the liquid cooling device 250 comprises a pump 252, a liquid cooling pipe 254, a heat exchanger 256, and a liquid coolant. When the pump 252 operates, the pump applies pressure to the liquid coolant inside the liquid cooling pipe 254 forcing the liquid coolant to circulate within the liquid cooling pipe 254. The liquid coolant flows inside the liquid cooling pipe 254, which passes through the shielding cover 260 to be in thermal contact with the second heat source 240, and absorbs the thermal heat generated by the second heat source 240. After the liquid coolant is heated, its temperature increases and, in some embodiments, the liquid coolant is vaporized before entering the heat exchanger 256 to undergo another heat exchange process therewith to be cooled to a lower temperature. The thermal heat thus is released by the heat exchanger 256 outside the server system 5. Therefore, because of the liquid coolant circulating in the liquid cooling pipe 254, the liquid cooling device 250 may dissipate the heat from the second heat source 240 to the outside of the server system 5.

When the fan module 30 is in use, the outside air is taken into the server 20 by the fan module 30 and, since the second heat source 240 is covered by the shielding cover 260, the forced air flow produced by the fan module 30 is designed mainly to cool the first heat source 230 in the air-cooled space 280. In comparison to the design that devotes an air flow produced by the fan module 30 to the entire space within the server 20 for heat exchange, the air flow produced by the fan module 30 of the present embodiment avoids engaging heat exchange with the second heat source and thus is able to maintain less temperature and better heat exchange rate, making the server system and the server of the present embodiment to have better heat dissipation efficiency. On the other hand, since the fact that the liquid cooling device 250 is used for cooling the second heat source 240 inside the liquid-cooled space 290 solely, the flow path of the liquid cooling device 250 is designed in close contact with the second heat source 240 mainly instead of all the heat generating components. In comparison to prior art approaches, the flow path of the conventional liquid cooling device is in contact with all heat generating components, which causes a more complicated design of flow path. Therefore, the flow path of the liquid cooling device of the server system and the server of the present embodiment of the present disclosure is more simple and explicit than that of the prior art.

Figure 3A:
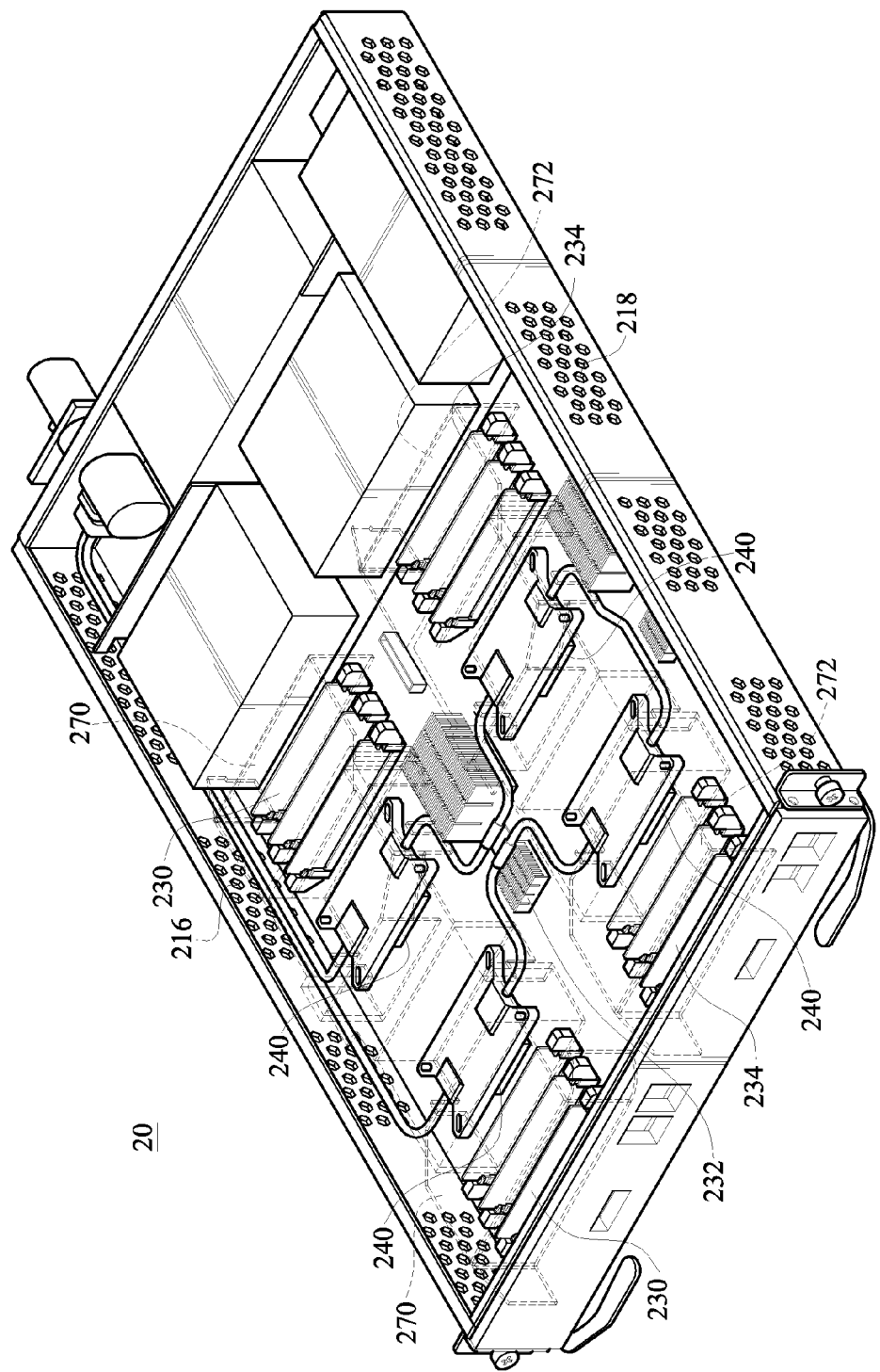
FIG. 3A is a schematic perspective view of a server and a deflector in FIG. 1 according to the present disclosure.
Figure 3B:
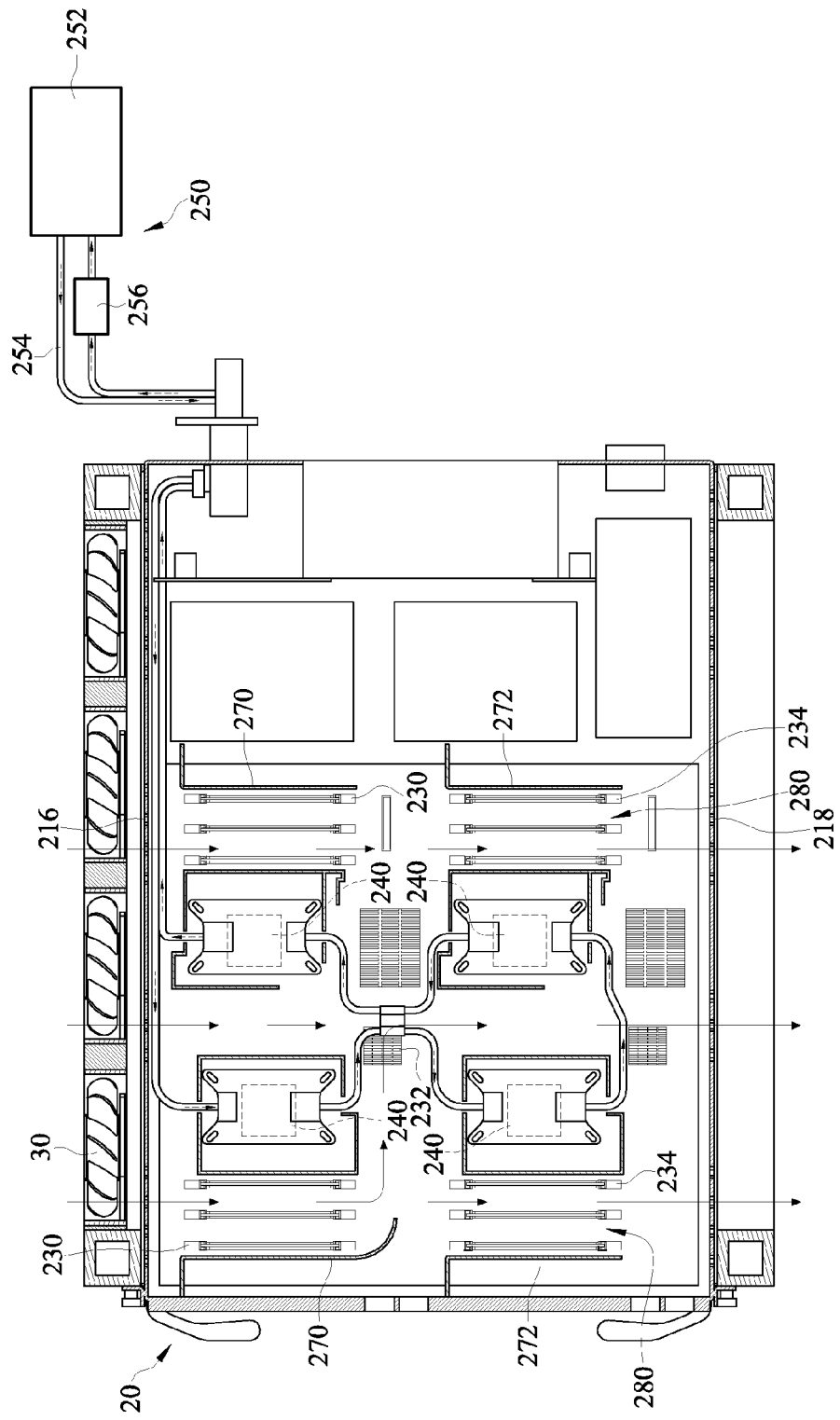
FIG. 3B is a cross-sectional top view of a server, a deflector and a fan module in FIG. 1 according to the present disclosure.

Please refer to FIG. 3A and FIG. 3B, FIG. 3A is a schematic perspective view of a server and a deflector in FIG. 1 according to the present disclosure, and FIG. 3B is a cross-sectional top view of a server, a deflector, and a fan module in FIG. 1 according to the present disclosure. In the present embodiment and other embodiments, the server 20 further comprises a third heat source 232 positioned between the second heat sources 240. Due to the fact that an air flow tends to move toward the directions having less interference, thus when the fan module 30 is in use, the produced air flow thereof drawn to the first heat source 230 is greater than another produced air flow drawn to the third heat source 232 such that only a small amount of thermal heat is released by the third heat source 232 to be transferred away by the air flow, resulting in a low heat dissipation rate on the third heat source 232. In order to solve the above-mentioned problem, the server 20, in the present embodiment and in other embodiments of the present disclosure, also comprises a deflector 270 installed in the chassis 210. By means of the shielding cover 260 and the deflector 270, the air drawn from the air inlet 216 is led to the third heat source 232 and carries the thermal heat generated by the third heat source 232 away from the server 20.

The functions that the deflector 270 are not only used for guiding the air flow toward the third heat source 232 located between the second heat sources 240 but also gathering the air flow in the present embodiment and in other embodiments of the present disclosure. In the present embodiment and other embodiments of the present disclosure, the server 20 also comprises a fourth heat source 234 and another deflector 272. The fourth heat source 234 is disposed on the circuit board 220 and the deflector 272 is located in the chassis 210. The deflector 272 is located next to the fourth heat source 234 and forms a tunnel-like structure for gathering the air flow produced by the fan module 30 and guiding the air flow to pass through the fourth heat source 234 along the deflector 272 such that the thermal heat generated by the fourth heat source 234 is removed from the server 20. Thus the heat dissipation efficiency of the server 20 is increased.

To further improve the heat dissipation efficiency of the server and to simplify the design of the liquid cooling device, the layout of the air-cooled space and the liquid-cooled space is further organized. Please refer to FIG. 4, which is a cross-sectional top view of a server according to another embodiment of the present disclosure. The present embodiment illustrated in FIG. 4 is similar to that in FIG. 1 with same reference numerals representing identical or similar components. Therefore, only the differences between this embodiment and the first embodiment in FIG. 1 are further described. In the present embodiment and other embodiments of the present disclosure, the server 20' is divided into several air-cooled spaces 280' and several liquid-cooled spaces 290'. The first heat sources 230', having less heat generating power, is located in the air-cooled spaces 280'. The second heat sources 240', having higher heat generating power, is covered by shielding covers 260', located in the liquid-cooled spaces 290' respectively. Several air flow paths are defined in the server 20' to guide the air flow which is produced by the fan module 30' and moves along the straight air flow paths in the air-cooled space 280' through the first heat sources 230', without adding deflectors to adjust the air flow direction toward the first heat sources 230' for heat dissipation. Therefore, in this embodiment, the air flow path is shortened and the heat dissipation efficiency of the server 20' is increased, which leads to a less complex piping layout of the liquid cooling device 250'. For example, the piping layout of the liquid cooling device 250' has less turns to make without encountering the first heat sources 230' and fewer times to pass through the shielding covers 260', thus making the installation of the cooling pipes of the liquid cooling devices 250' easier and straight forward.

According to the above-mentioned embodiments of the server system and the server of the present disclosure, the shielding covers, which cover the second heat sources, divide the internal volume of the server into the air-cooled space and the liquid-cooled space, leading the flow rate of the air flow passing through the first heat sources great than the flow rate of another air flow passing through the second heat sources, and preventing the air flowing by the first heat sources from gaining thermal heat from the second heat sources. Therefore, the present embodiment increases the heat dissipation rate of the air flow on the first heat sources. In addition, in the present embodiment, using the liquid cooling device to absorb and remove the thermal heat generated by the second heat sources, which are covered by the shielding covers, prevents the temperatures of the air flows inside the shielding covers from increasing. Therefore, in comparison to the prior art, the present embodiment of the present disclosure has better heat dissipation efficiency.

Furthermore, in some of other embodiments of the present disclosure previously described, the server is divided into several air-cooled space, several liquid-cooled space, and several air flow paths included to shorten the route of the air flow produced by the fan module, thus to increase the heat dissipation efficiency of the server. In addition, design of the coolant pipe of the liquid cooling device is simplified.

What is claimed is:
1. A server system, comprising:
  a rack;
  a server located in the rack, and the server comprising:
    a chassis;
    a circuit board disposed on the chassis;
    a first heat source disposed on the circuit board;
    a second heat source disposed on the circuit board;
    a liquid cooling device thermally connected to the second heat source; and
    a shielding cover disposed on the chassis and covering the second heat source; and
  a fan module located in the rack;
  wherein, when the fan module is in operation, outside air is taken into the server by the fan module, and the second heat source is capped by the shielding cover such that the flow rate of an air flow passing by the first heat source is greater than the flow rate of another air flow passing by the second heat source.

2. The server system according to claim 1, wherein the heat generating power of the first heat source is less than the heat generating power of the second heat source.

3. The server system according to claim 1, wherein the chassis includes a main board and two side walls opposite to each other, and one of the side walls includes an air inlet corresponding to the first heat source.

4. The server system according to claim 3, wherein the server further includes a deflector disposed on the chassis, and the deflector and shielding cover is used for guiding the air from the air inlet toward the first heat source together.

5. The server system according to claim 1, wherein the liquid cooling device comprises:
  a pump;
  a liquid cooling pipe connected to the pump and passing through the shielding cover to be thermally connected with the second heat source;
  a heat exchanger connected to the liquid cooling pipe; and
  a liquid coolant contained in the liquid cooling pipe.

6. A server, comprising:
  a chassis;
  a circuit board disposed on the chassis;
  a first heat source disposed on the circuit board;
  a second heat source disposed on the circuit board;
  a liquid cooling device thermally connected to the second heat source; and
  a shielding cover disposed on the chassis and covering the second heat source such that the flow rate of an air flow passing by the first heat source is greater than the flow rate of another air flow passing by the second heat source.

7. The server according to claim 6, wherein the heat generating power of the first heat source is less than the heat generating power of the second heat source.

8. The server according to claim 6, wherein the chassis includes a main board and two side walls opposite to each other, and one of the side walls includes an air inlet corresponding to the first heat source.

9. The server according to claim 8, wherein the server also includes a deflector disposed on the chassis, and the deflector and the shielding cover guides the air from the air inlet toward the first heat source together.

10. The server according to claim 6, wherein the liquid cooling device comprises:
  a pump;
  a liquid cooling pipe connected to the pump and passing through the shielding cover to be thermally connected with the second heat source;
  a heat exchanger connected to the liquid cooling pipe; and
  a liquid coolant contained in the liquid cooling pipe.

* * * * *